(12) United States Patent
Tadeparthy et al.

(10) Patent No.: US 7,193,554 B1
(45) Date of Patent: Mar. 20, 2007

(54) QUANTIZER CIRCUIT

(75) Inventors: Preetam Charan Anand Tadeparthy, Bangalore (IN); Jomy G Joy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/308,242

(22) Filed: Mar. 14, 2006

(51) Int. Cl.
*H04N 7/26* (2006.01)

(52) U.S. Cl. .................... 341/200; 341/155; 341/136; 341/135

(58) Field of Classification Search ............ 341/200, 341/135, 136, 120, 122, 155, 165
See application file for complete search history.

(56) References Cited

U.S. PATENT DOCUMENTS

| | | | | |
|---|---|---|---|---|
| 4,237,387 A * | 12/1980 | Devendorf et al. | ......... | 327/223 |
| 4,893,122 A * | 1/1990 | Hoehn | ........... | 341/122 |
| 5,859,559 A * | 1/1999 | Hong et al. | .......... | 327/359 |
| 6,118,395 A * | 9/2000 | Kim | ........... | 341/135 |
| 6,369,743 B2 * | 4/2002 | Ono | ........... | 341/159 |
| 6,420,932 B1 * | 7/2002 | Casper | ........ | 330/258 |
| 6,703,956 B1 * | 3/2004 | Mueller et al. | ............ | 341/145 |
| 6,970,124 B1 * | 11/2005 | Patterson | ........ | 341/155 |
| 7,071,858 B2 * | 7/2006 | Pan | ........... | 341/133 |
| 2001/0007443 A1 * | 7/2001 | Ono | ........... | 341/159 |
| 2003/0001767 A1 * | 1/2003 | Gendai | ........ | 341/155 |

* cited by examiner

*Primary Examiner*—Linh Nguyen
(74) *Attorney, Agent, or Firm*—William B Kempler; W. James Brady; Frederick J. Telecky, Jr.

(57) ABSTRACT

According to an aspect of present invention, a quantizer is provided with reduced power consumption and area. Such a feature is attained by providing the input signal and a reference signal on input terminals of a pre-amplifier, and coupling the differential output terminals of the pre-amplifier to the gate terminal of respective transistors. The drain/source currents of the transistors are provided to a current latch, which generates the comparison result. The latches and transistors are replicated conveniently to interpolate additional reference values. The width to length (W/L) of the channels in each replicated set are set to different values to cause the reference signal to be at corresponding strength.

14 Claims, 6 Drawing Sheets

QUANTIZER CIRCUIT

BACKGROUND

1. Field of the Invention

The present invention relates generally to the design of integrated circuit, and more specifically to the implementation of a quantizer circuit which translates a sample of an input signal (amplitude/strength/sample) to a nearest values in a set of predefined reference values.

2. Related Art

A quantizer generates one of a possible set of output values with each of the set of output values representing a corresponding quantized level of a signal strength and the generated value representing the value corresponding to the quantized level closest to the strength of an input signal/sample, as is well known in the relevant arts. The translated value is generally represented using digital bits and provided as a corresponding output.

Generally, quantization is performed using a number of comparators with each comparator comparing the input signal with one of a predefined reference levels. The result of each comparison thus indicates whether the input signal exceeds the strength of the corresponding reference (quantized) level. The comparison results can then be used to generate a quantized (output) value. Thus, the number of comparators used in a quantizer in one embodiment equals the number of reference levels with which comparison is sought to be performed.

A comparator is often implemented using a pre-amplifier and a latch. The latch generates first logic value when a input signal strength is greater than the reference value and generates a second logic value otherwise. Pre-amplifiers are implemented (with a gain) to reduce various errors such as latch offset, glitches due to switching etc., at the input of the comparator as is well known in the relevant arts. However, pre-amplifiers often consume large area and power.

Thus, as the number of comparators (or quantization levels) increases, it is often desirable to reduce the number of pre-amplifier to meet various requirements such as reduced area/power consumption.

BRIEF DESCRIPTION OF THE DRAWINGS

The present invention will be described with reference to the following accompanying drawings.

Figure (FIG.) 1 is a block diagram illustrating the internal structure of an example multistage ADC in which various aspect of present invention can be implemented.

In the drawings, like reference numbers generally indicate identical, functionally similar, and/or structurally similar elements. The drawing in which an element first appears is indicated by the leftmost digit (s) in the corresponding reference number.

DETAILED DESCRIPTION

1. Overview

According to an aspect of present invention, the size of pre-amplifiers used in the implementation of a quantizer is reduced, thereby reducing the power consumption and area requirements. Such a feature is attained by providing the input signal and a reference signal on input terminals of a pre-amplifier, and coupling the differential output terminals of the pre-amplifier to the gate terminal of respective transistors. The drain/source currents of the transistors are provided to a current latch, which generates the comparison result. The latches and transistors are replicated conveniently to interpolate additional reference values. The width to length (W/L) of the channels in each replicated set are set to different values to cause the reference signal to be at corresponding strength.

Since the output terminals of the pre-amplifier are connected to the gate terminals of the transistor, the pre-amplifiers operate with minimal load, thereby leading to requirement of pre-amplifiers with reduced size/power.

According to yet another aspect of the present invention, the latches noted above are implemented using transistors, thereby enabling the latch to be integrated with the transistors implementing the interpolation operation. Such a feature also leads to reduced area/power requirements.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
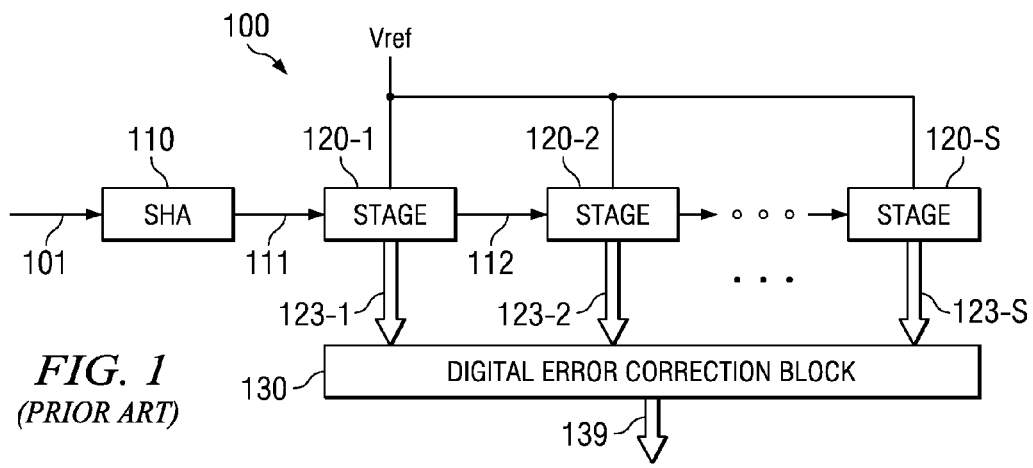

FIG. 1 is a block diagram of a pipe line ADC 100 illustrating an example environment in which various aspects of present invention may be implemented. ADC 100 is shown containing sample and hold amplifier (SHA) 110, stages 120-1 through 120-S, and digital error correction block 130. Each block is described below in further detail.

SHA 110 samples the input analog signal received on path 101 and holds the voltage level of the sample on path 111 for further processing. Digital error correction block 130 receives sub-codes from various stages, and generates a digital code corresponding to the sample received on path 111. Various error correction approaches, well known in the relevant arts, may be used to correct any errors in the received sub-codes. The generated digital code is provided on path 139 as final digital code corresponding to a input analog signal at a particular time instant.

Figure 2:
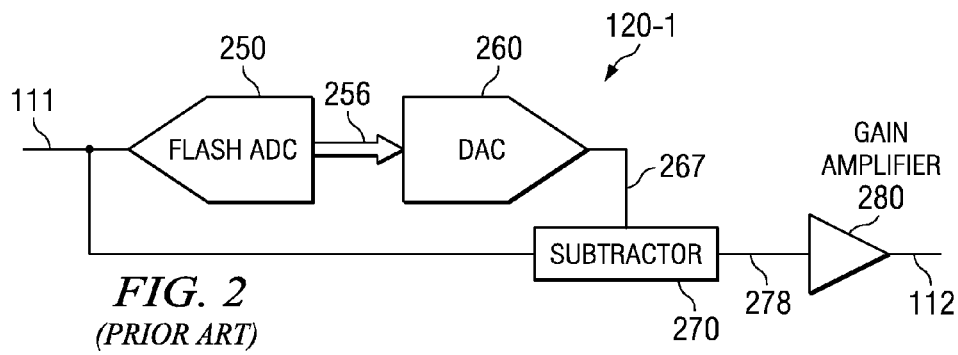
FIG. 2 is a block diagram illustrating the general operation of a stage of an ADC.

Each stage 120-1 through 120-S generates a sub-code (based on the reference signal Vref) corresponding to a voltage/signal level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is provided to stages 120-1 through 120-S. FIG. 2 further illustrates (logical) components contained in each stage (described with reference to stage 120-1 only, for conciseness) of a pipe line ADC 100 according to a known approach.

With respect to FIG. 2, stage 120-1 is shown containing flash ADC 250 (an example of a quantizer), digital to analog converter (DAC) 260, subtractor 270 and gain amplifier 280. Flash ADC 250 converts a sample of an analog signal received on path 111 into a corresponding p-bit sub-code provided on path 256 (contained in path 123-1 of FIG. 1, and P is less than N). DAC 260 converts the sub-code received on path 256 into corresponding analog signal (Vdac) on path 267.

Subtractor 270 generates a residue signal as the difference of input sample (Vi) received on path 111 and the analog signal (Vdac) received on path 267. Gain amplifier 280 amplifies the residue signal (Vi-Vdac) and is provided on path 112 as an amplified residue signal. The signal on path 112 is used to resolve the remaining bits in the N-bit digital code by the subsequent stages of the ADC. The manner in which residue signal (Vi-Vdac) are generated by each stage is described below with respect to FIG. 3.

Figure 3:
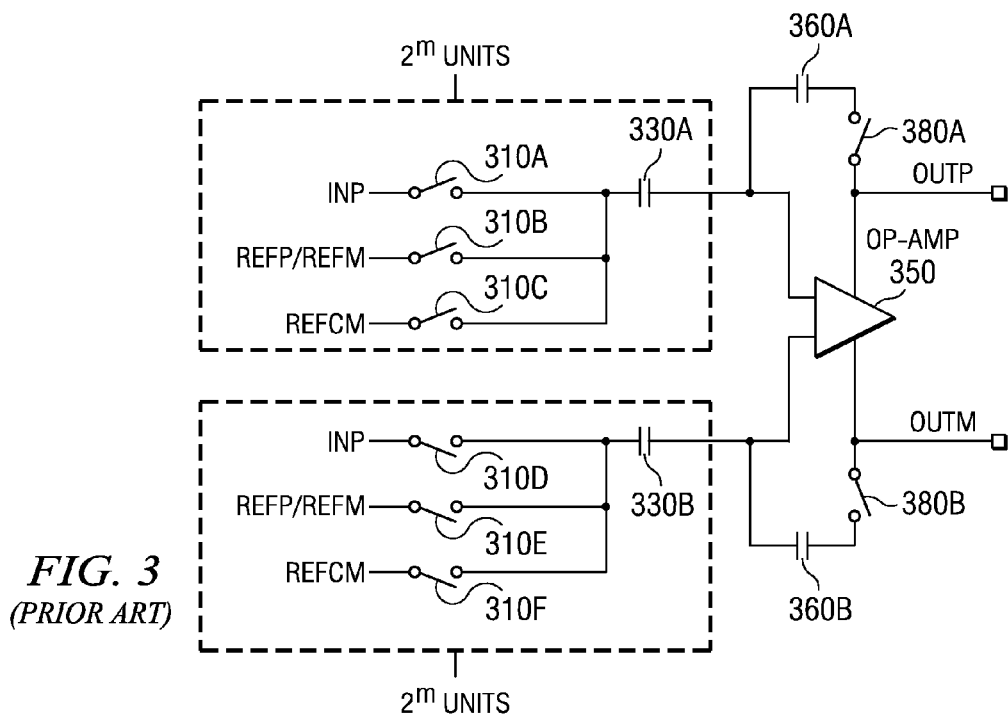
FIG. 3 is a circuit diagram illustrating the implementation of a DAC, residue amplifier and a substracter of a stage according to a prior approach.

Continuing description with respect to FIG. 3, DAC 260, subtractor 270, and gain amplifier 280 are together implemented using a capacitor network, switches and a operational amplifier (Op-amp). FIG. 3 is a circuit diagram shown containing Op-amp 350, input capacitors 330A and 330B, feedback capacitors 360A and 360B and switches 310A–310F, 380A and 380B. Each component is described below in further details.

The circuit in FIG. 3 operate in two phases. In the first phase (sampling phase) switches 310A and 310D are closed and remaining switches 310B, 310C, 310E, 310F, 380A and 380B are kept open. As a result, input capacitors 330A and 330B stores a charge proportional to the input analog signal received on path 111.

In the second phase, switches 380A and 380B are closed and switches 310A and 310D are kept open. Connections of switches 310B, 310C, 310E and 310F are made such that the input terminals of the sampling capacitors 330A and 330B are connected either to REFP/REFM terminal or to REFCM terminal.

As a result, capacitors 330A and 330B transfer a charge proportional to the difference (difference signal) of input signal and the REFP/REFM or REFCM to feedback capacitors 360A and 360B. The difference is amplified by Op-amp 350 and provided as amplified residue signal to the next stage.

Figure 4:
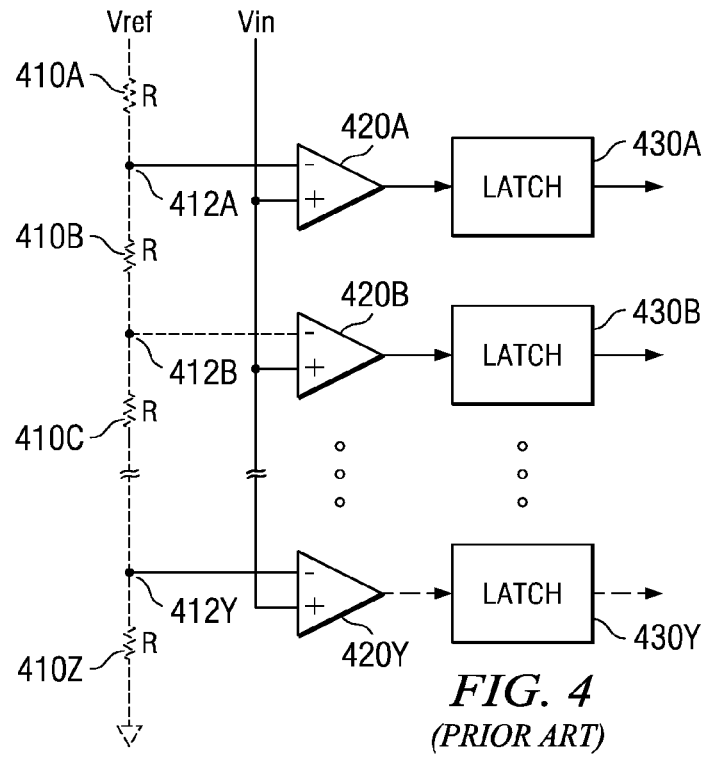
FIG. 4 is a block diagram of a portion of flash ADC illustrating an example quantizer in one prior embodiment.

The connections of switches 310B, 310C, 310E and 310F are made (operated) based on the output of the flash ADC 250 (sub code). Description is continued with respect to an example prior flash ADC (example of a quantizer) generating p bit sub-code, 3. Prior Quantizer FIG. 4 is a block diagram of a portion of flash ADC 250 illustrating the details of an example quantizer in one prior embodiment. The block diagram is shown containing resistors 410A–410Z, pre-amplifiers 420A–420Y and latches 430A–430Y. Each component is described below in further detail.

Resistors 410A–410Z (generally of equal resistance values) operates as a resistor ladder network and divides the reference voltage Vref into equal voltage step. The voltage levels at nodes 412A–412Y represents set of predetermined reference strengths. In a flash ADC 250 generating p-bits sub-code ($2^p$ quantization levels), the number of resistors 410A–410Z equals (($2^p$)+1), wherein '^' represents 'power of' mathematical operation.

Each pre-amplifier 420A–420Y and latch 430A–430Y respectively operate together as comparators. The inverting terminals of pre-amplifiers 420A–420Y respectively receives reference strengths on nodes 412A–412Y. The input analog samples Vin (on path 111) are provided to non-inverting terminals of the pre-amplifiers 420A–420Y.

Pre-amplifiers 420A–420Y amplifies the difference between the input signal and the corresponding reference strengths (on nodes 412A–412Y) and the amplified difference signals are provided to latches 430A–430Y. Latches 430A–430Y operate as a zero crossing detector and generate a logic high and logic low respectively for pre-amplifiers 420A–420Y output greater than zero and less than zero.

However, number of pre-amplifiers required according to the approach described above equals the number of reference level (quantization levels). For example, to generate a p-bits sub-code, the number of pre-amplifiers required equal $2^p$ (wherein symbol ^ indicates a 'power of' operation). However, for large values of p (high resolution), implementation of corresponding number of pre-amplifiers pose various constrains such as power consumption, area etc., and may become impractical.

In one prior embodiment, the number of pre-amplifiers required is reduced using a interpolation technique. Accordingly the interpolation technique is described with reference to FIGS. 5, 6 and 7 in further detail.

4. Interpolation

Figure 5:
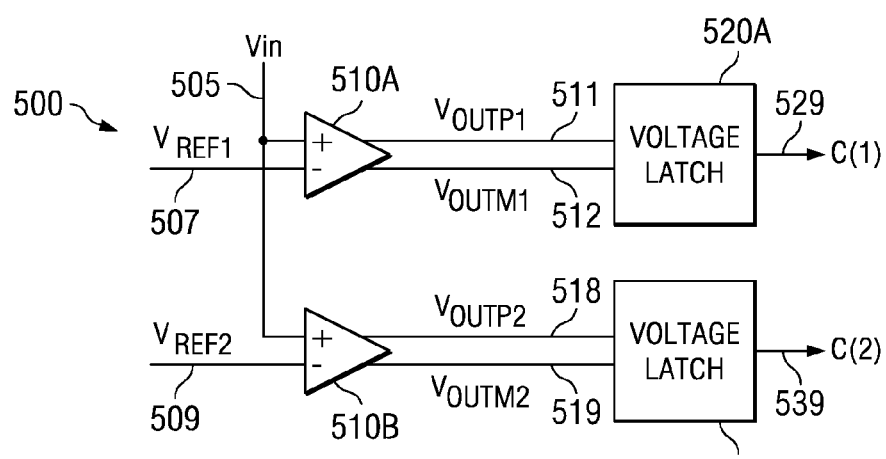
FIG. 5 is a circuit diagram of an example quantizer illustrating interpolation technique using which the number of pre-amplifiers can be reduced in a prior embodiment.

FIG. 5 is a circuit diagram of an example quantizer illustrating interpolation technique. The circuit diagram is shown containing pre-amplifiers 510A and 510B, and voltage latches 520A and 520B. The operation of each component is described below in further detail.

Each pre-amplifier 510A and 510B receives a differential input and generates a differential output. The input analog samples (Vi) is provided to non-inverting input terminals of both pre-amplifiers 510A and 510B. The inverting terminals of pre-amplifiers 510A and 510B are respectively connected to reference level (voltage) 507 (Vref1) and another reference level (voltage) 509 (Vref2).

The output terminals outP1 and outM1 of pre-amplifier 510A generating differential outputs (on paths 511 and 512) are provided as inputs to latch 520A. Similarly differential outputs outP2 and outM2 (on paths 518 and 519) of pre-amplifier 510B are provided as inputs to latch 520B. The manner in which the differential outputs outP1, outM1, outP2 and outM2 vary with the input analog samples (Vi) is illustrated with reference to FIG. 6.

Figure 6:
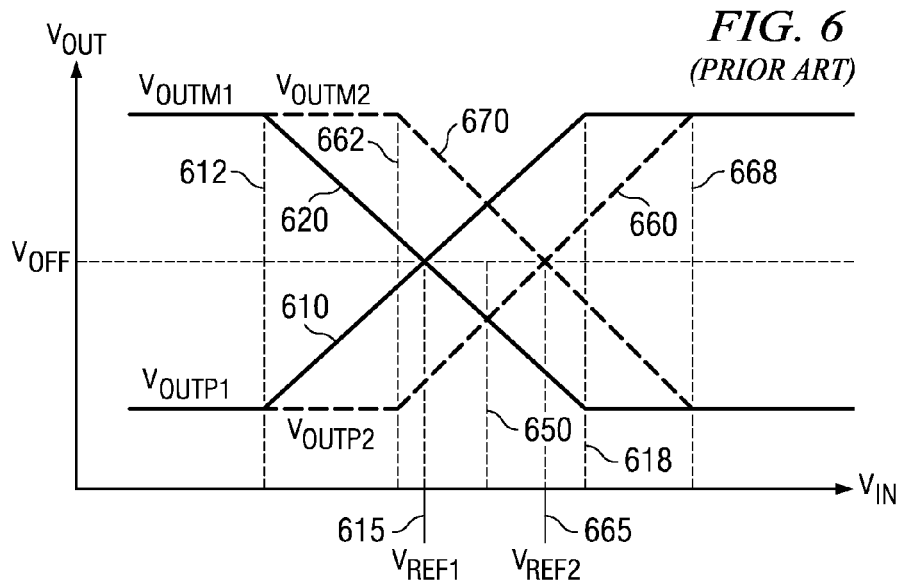
FIG. 6 is a graph representing the outputs of the pre-amplifiers illustrating interpolation technique generally.

FIG. 6 is a graph representing the outputs of the pre-amplifiers 510A–510B as a function of the input voltages, illustrating interpolation technique. The strength of the input analog sample value (Vin) is represented on X-axis and that of output value is represented on Y-axis. The graph is shown containing curves 610, 620, 660 and 670. Each curve is described below in further detail.

Curves 610 and 620 (represented in thick line) respectively represents outputs outP1 and outM1. The outP1 is shown increasing from a minimum value and outM1 is shown decreasing from maximum value when input value (Vin) increases above a value (point) 612. The outP1 is shown reaching the maximum value and outM1 is shown reaching the minimum value at input value (Vin) 618. The two outputs are shown (outP1 and outM1) crossing each other (at point 615) at a input value (Vin) equaling Vref1.

Similarly, curves 660 and 670 (represented in dotted line) respectively represents outputs outP2 and outM2. The outP2 is shown increasing from the minimum value and outM2 is shown decreasing from maximum value when input value (Vin) increases above a value (point) 662. The outP2 is shown reaching the maximum value and outM2 is shown reaching the minimum value at input value (Vin) 668. The two outputs are shown (outP2 and outM2) crossing each other (at point 665) at an input value (Vin) equaling Vref2.

Latch 520A generates a logic high when outP1 is greater than outM1 (corresponding to Vin greater than Vref1 value (point 615 (Vref1)) and generates a logic low when outP1 is less than outM1 (corresponding to Vin less than Vref1). Similarly, latch 520B generates a logic high for Vin greater than Vref2 (point 665) and generates a logic low value for Vin less than Vref2.

The manner in which a third reference value Vref3 is generated (interpolated) using outputs outP1, outP2, outM1, and outM2 (interpolation factor2) is described below in further detail.

A new differential outputs outP3 and outM3 may be obtained as:

$$outP3=(outP1+outP2)/2=Voff+G[Vin-(Vref1+Vref2)/2] \quad \text{Equation (1)}$$

$$outM3=(outM1+outM2)/2=Voff-G[Vin-(Vref1+Vref2)/2] \quad \text{Equation (2)}$$

wherein, G represents gain off pre-amplifier and Voff represents out put common mode value (voltage).

From the above equations, it may be appreciated that the outP3 and outM3 crosses at a value Vref3=(vref1+ref2)/2 (point 650) thereby providing a third reference value without additional pre-amplifier. Accordingly a latch may be added to receive outP3 and outM3 to generates a logic high when input signal (Vin) is greater than Vref3 and generates a logic low otherwise.

Figure 7:
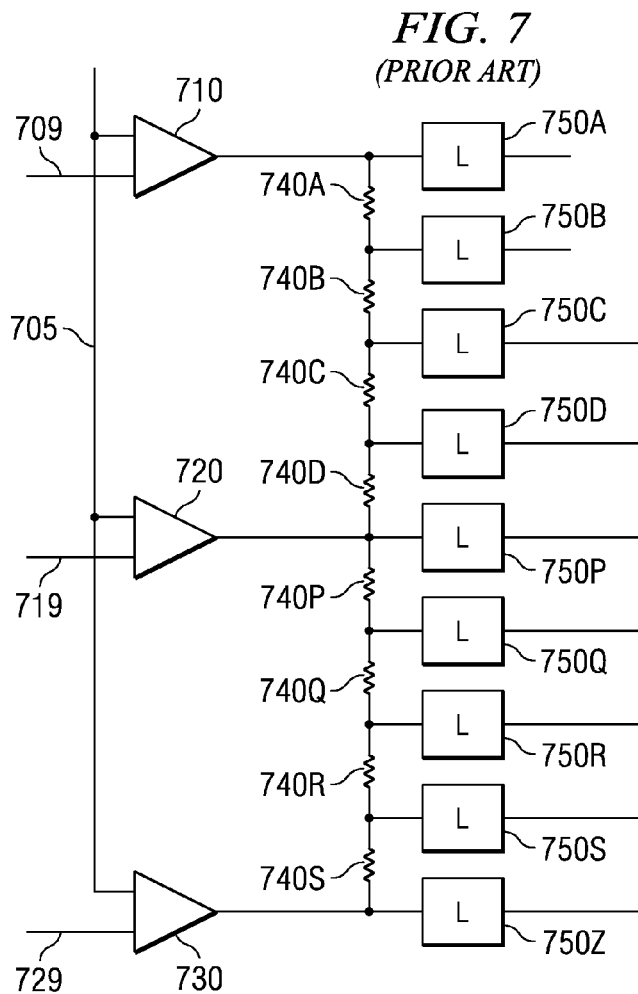
FIG. 7 is circuit datagram illustrating interpolation of multiple intermediate reference values (interpolation factor more than 2) in a prior embodiment.

In order to interpolate multiple intermediate reference strengths (interpolation factor more than 2), a resistor network is used between two successive pre-amplifiers outputs as shown in FIG. 7. Shown there pre-amplifiers 710, 720 and 730, resistors 740A–740D and 740P–740S, and latch 750A–750D and 750P–750Z. Each component is described below in further detail.

Assuming pre-amplifiers 710 and 720 respectively receive reference strengths Vref1 and Vref2, resistors ladder formed by resistors 740A–740D (M number of resistors) provide M−1 intermediate reference strengths (at nodes 741, 742, and 743) between Vref1 and Vref2. Similarly resistor ladder formed by resistors 740P–740S generates a equal number (M−1) of intermediate reference levels between Vref2 and Vref3 (assuming a reference Vref3 is received by pre-amplifier 730).

Due to resistor ladder network, number of reference strengths obtained (using only 3 pre-amplifiers) equals 2*(M−1)+3. For example, for M=4 (as shown in FIG. 7), 9 threshold (reference strengths) values are obtained using 3 pre-amplifiers. The interpolated reference strengths are provided as inputs to latches 750A–750D and 750P–750Z to generate a digital bits representing the quantizer output representing input samples Vin, However, circuit in FIG. 7 offers a undesirable high load due to resistor ladder (draws current) to pre-amplifier. As a results pre-amplifiers 710, 720 and 730 may need to be implemented to support such high load requirement resulting in large area and high power consumption.

Various features of the present invention overcome at least some of the disadvantages noted above. Various aspects of present invention will be clearer by understanding the underlaying principles of operation of a comparator, and accordingly the operation of a comparator is described first.

5. Comparator

Figure 8:
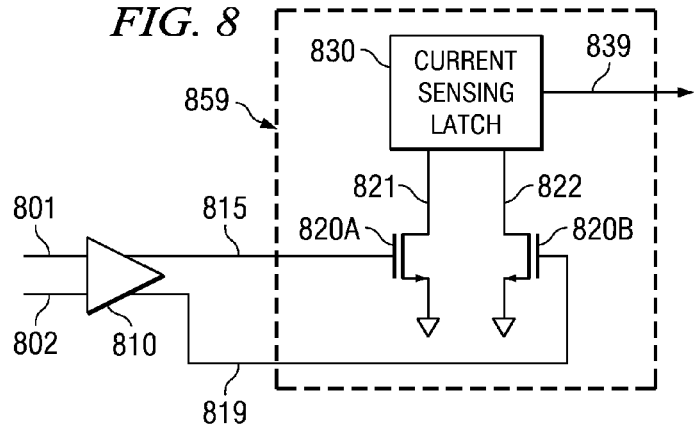
FIG. 8 is a block diagram illustrating the details of operation of a comparator in one embodiment.

FIG. 8 is a block diagram of a comparator illustrating underlaying principles of operation in one embodiment. The block diagram is shown containing pre-amplifier 810, transistors 820A and 820B, and current sensing latch 830. Each component is described below in further detail Current sensing latch 830 receives two currents Idp and Idm on paths 821 and 822 respectively, and compares the currents Idp and Idm to generate comparison result (a logic high/low) on output terminal 839. Pre-amplifier 810 operates similar to operation of pre-amplifier 510A. Accordingly pre-amplifier 810 receives a reference signal (Vref) on one of the input terminals and an input analog sample (Vin) on the other input terminal. The differential outputs VoutP and VoutM are respectively provided on paths 815 and 819.

Each transistor 820A and 820B contains a gate terminal and a pair of terminals (source and drain) having a current channel in between. The gate terminals of transistors 820A and 820B are respectively connected to VoutP and VoutM and drain terminals of transistors 820A and 820B are respectively connected to paths 821 and 822. Transistors 820A and 820B are operated in a linear region (triode region).

In general, the drain current Id of a transistor (MOSFET) in linear region is given by:

$$I_D = \mu_n C_{OX}(W/l)[(V_{GS}-V_{tn})V_{DS}-(V_{DS}^2/2)] \quad \text{Equation 3}$$

wherein VGS represents voltage between gate terminal and source terminal, Vtn represents a threshold voltage, VDS represents voltage between drain terminal and source terminal, W and L respectively represents width and length of the channel.

Assuming VDS to be constant, equation 3 may be represented as:

$$I_D = \beta(W/L)V_{GS}+I_{OFF} \quad \text{Equation 4}$$

wherein Ioff represents the DC offset current and $$\beta = \mu_n C_{OX} V_{GS}$$

From equations 1, 2, 3 and 4, the current on path 821(Idp) and 822 (Idm) may be represented as:

$$I_{DP}=I_{DC}+\alpha(W/L)[V_{IN}-V_{REF}] \quad \text{Equation 5}$$

and $$I_{DN}=I_{DC}-\alpha(W/L)[V_{IN}-V_{REF}] \quad \text{Equation 6}$$

From the above equations it may be appreciated that currents Idp and Idm are proportional to differential outputs VoutP and VoutM and crosses each other at a value IDC when Vin=.Vref. Accordingly, the current latch effectively compares Vin with respect to Vref and generates the logical high when Vin is greater than Vref (corresponding to Idp>Idm) and a logic low otherwise.

Since outputs from pre-amplifier 810 are provided to gate terminals of transistors 820A and 820B, the pre-amplifier is not loaded (as would be apparent to one skilled in the relevant arts). Hence, pre-amplifier 810 may be implemented with reduced size and power consumption thereby reducing the power consumption and area of the ADC. The manner in which the interpolation may be performed using above technique is described below with reference to FIG. 9.

6. Novel Interpolation

Figure 9:
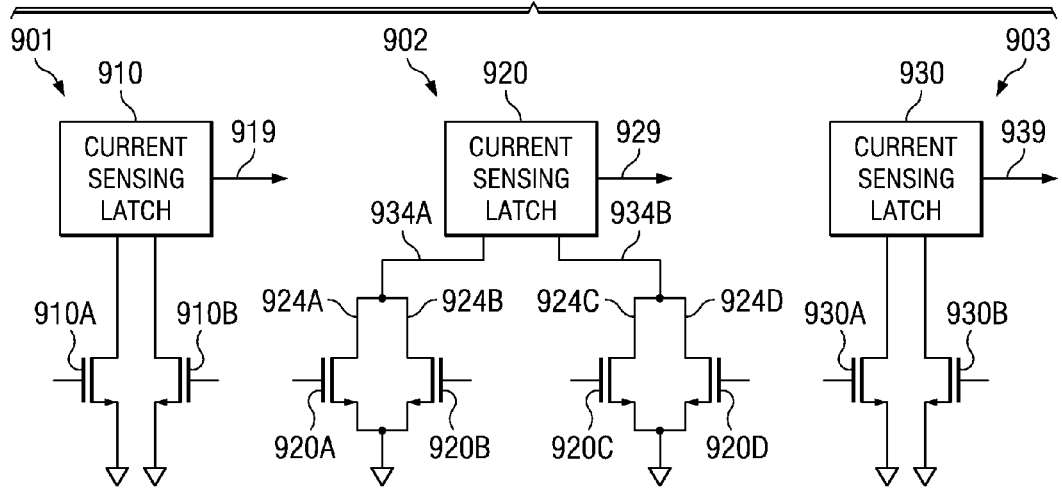
FIG. 9 is a block diagram illustrating the manner in which interpolation is performed in an embodiment of the present invention.

FIG. 9 is a block diagram illustrating the manner in which interpolation is performed in an embodiment of the present invention. The block diagram is shown containing current sensing latches (current latch) 910, 920 and 930, and transistors 910A, 910B, 920A–920D, 930A and 930B.

FIG. 9 is described below with reference to differential outputs of pre-amplifiers 510A and 510B in FIG. 5 merely for illustration. Accordingly, outputs outP1, outM1, outP2 and outM2 of FIG. 5 are used as inputs (on respective gate terminal) to circuit portions 901-903. Each component is described below in further detail.

Circuit portion 901 (comprising current sensing latch 910 and transistors and 910B) and 903 (comprising current sensing latch 930 and transistors 930A and 930B) operate similar to the circuit portion 859 in FIG. 8. The outputs outP1 and outM1 of pre-amplifier 510A are provided to gates terminals of transistors 910A–910B respectively (in circuit portion 901). As a result, current latch 910 generates a logic high for values of Vin greater than Vref1 and a logic low otherwise.

Similarly, outputs outP2 and outM2 of pre-amplifier 510B are respectively provided to gates terminals of transistors 930A–930B. As a result current latch 930 generates a logic high for values of Vin greater than Vref2 and a logic low for values Vin less than Vref2. Accordingly, input samples are compared with two reference strengths Vref1 (ref1) and Vref2 (ref2) and respective logic levels representing the comparison results are provided on paths 919 and 939.

Circuit portion 902 operates as interpolation circuit to generate a Nth reference strength (from the outputs of pre-amplifiers 510A and 510B) and compare the Nth reference strength with the input analog sample (Vin). The manner in which circuit portion 902 operates is described below in further detail.

Transistors 920A–920B respectively receives VoutP1 and VoutP2 on gate terminals and generates the currents Idp1 and Idp2 respectively on paths 924A and 924B connected to drain terminals. Similarly transistors 920C–920D receives outM1 and outM2 on gate terminals and generates a the currents Idm1 and Idm2 respectively on paths 924C and 924D.

From equations 1–6 the total current on path 934A and 934B may be represented as $$I_{DPM}+I_{Dpn}=\alpha[m(V_{IN}-V_{REF})+n(VIN-VREF_2)] \quad \text{Equation 7}$$

$$I_{DMm}+I_{DMm}=\alpha[m(V_{IN}-VREF_1)+n(VIN-VREF2)] \quad \text{Equation 8}$$

wherein represents a constant, m represents the W/L ratio of the first transistor (generating $I_{DPM}$) and n represents the W/L ratio of the second transistor generating $I_{Dpn}$.

Assuming m=n in the above equation, the two currents (I) provided to current sensing latch 930 cross each other at a input value vref3=(Vref1+vref2)/2 as a result current sensing latch 930 generates a logic high for values of input analog samples (Vin) greater than Vref3 and a logic low otherwise. In general, vrefq (i.e., qth interpolated reference strength) equals $(m_q*Vref1+n_q* Vref2)/(m_q+n_q)$, wherein $m_q$ and $n_q$ represent the specific values of m and n in equations 7 and 8.

Circuit portion 902 may be repeated with different m and n ratios to generate interpolation of degree more than 2. Such different values of m and n are attained by using corresponding W/L ratios for the transistors.

The manner in which a current sensing latch is implemented according to an aspect of present invention is described with reference to FIG. 10.

7. Current Sensing Latch

Figure 10A:
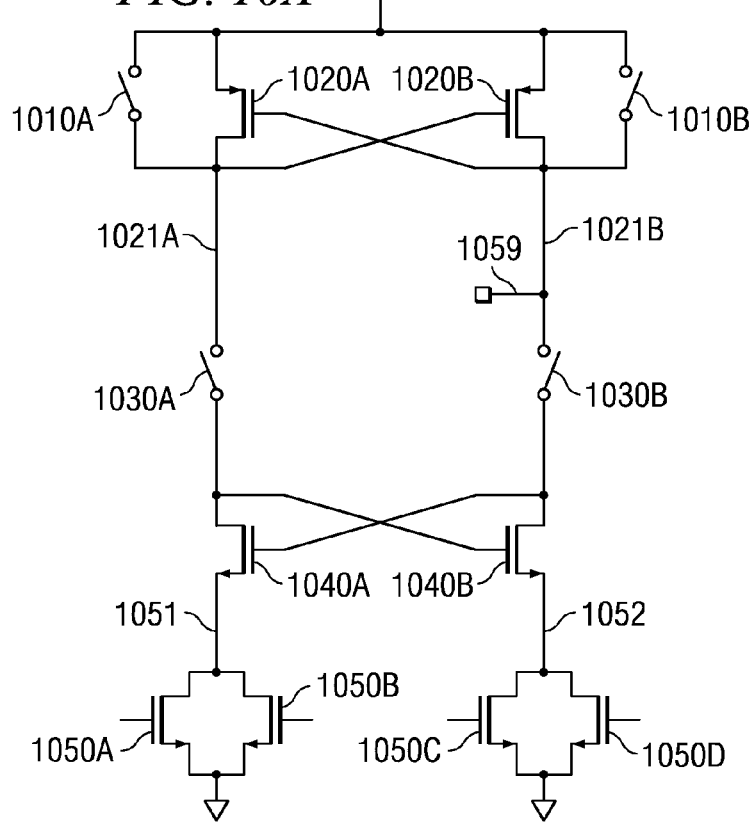
FIG. 10A is a circuit diagram of a current sensing latch in an embodiment of the present invention.

FIG. 10A is a circuit diagram of a current sensing latch 1000 (corresponding to each of latches 910, 920 and 930, but described with particular reference to 920) in an embodiment of the present invention. The circuit diagram is shown containing transistors 1020A, 1020B, 1040A, 1040B, 1050A–1050D, and switches 1010A, 1010B, 1030A and 1030B. Each component is described below in further detail.

Figure 10B:
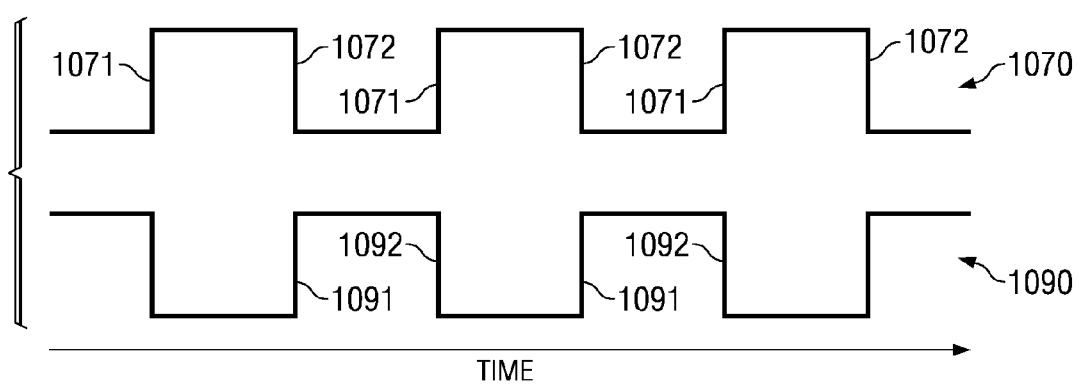
FIG. 10B is a timing diagram depicting two operational phases of circuit in FIG. 10A.
Figure 11:
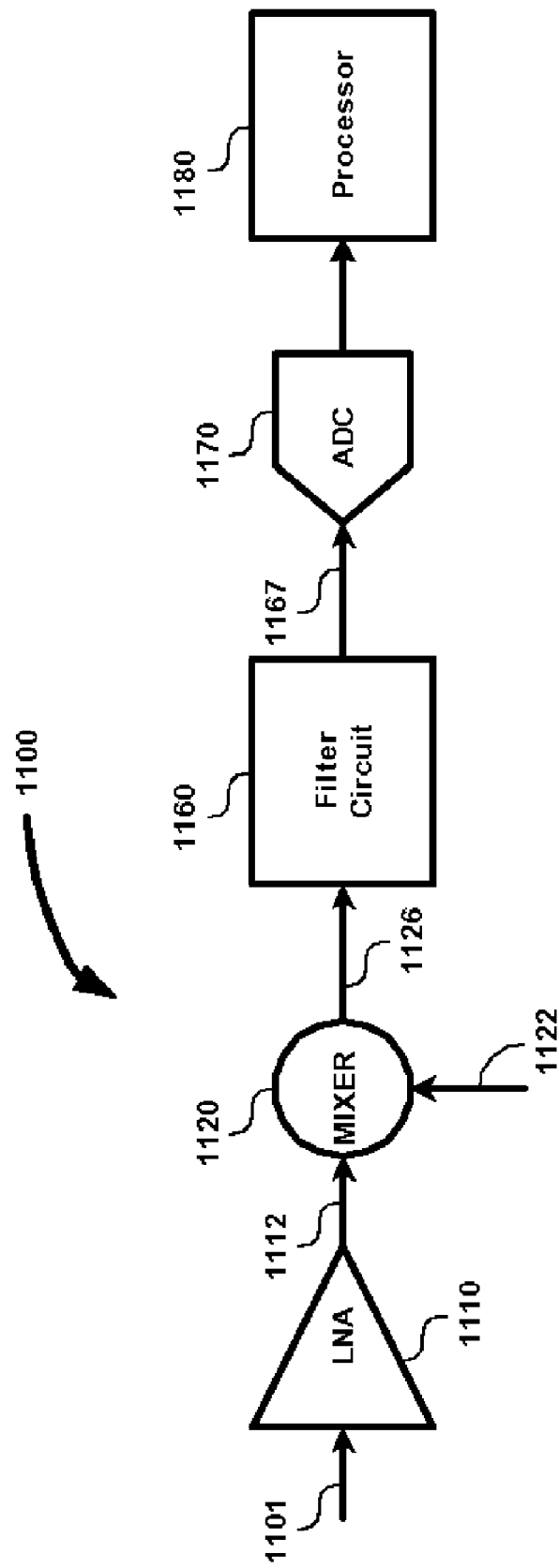

The circuit in FIG. 10A operates in two phases (reset phase and regeneration phase) using reset clock signal 1070 and regenerative clock signal 1090 depicted in FIG. 10B. In the reset phase (between time point 1071 and 1072), a logic high on reset clock signal 1070 closes switches 1010A and 1010B and a logic low on regenerative clock signal 1090 opens switches 1030A and 1030B. As a result, the outputs on path 1059 is pulled to VDD, and nodes 1051 and 1052 will be at zero potential. Accordingly (NMOS) transistors 1050A–1050D operate in triode region.

In the regeneration phase (between time point 1091 and 1092), switches 1010A and 1010B are opened and switches 1030A and 1030B are closed. Transistors 1050A–1050D operate similar to transistors 920A–920D in FIG. 9. Accordingly, transistors 1050A and 1050B respectively receives VoutP1 and VoutP2 on gate terminals and generates a the currents Idp1 and Idp2 on respective drain terminals. Similarly transistors 1050C and 1050D receives outM1 and outM2 on gate terminals and generates a the currents Idm1 and Idm2 on respective drain terminals.

The sum of currents Idp1 and Idp2 (according to Equation 7) and the sum of currents Idm1 and Idm2 (according to equation 8) are respectively provided on paths 1051 and 1052 (similar to paths 934A and 934B). The cross coupling between transistors (NMOS) 1040A–1040B, and transistors (PMOS) 1010A–1010B provides a positive feedback and causes a regeneration action. After the regeneration, the latch 1000 provides a resultant voltage at output 1059 similar to 929 in FIG. 9).

It may be appreciated from the above description, the circuit of FIG. 10A performs operations of both interpolation and latch. The length and width of transistors 1050A–1050D may be varied to attain multiple interpolated reference strengths thereby obtaining a large number of quantization levels. Since the latch and interpolation circuits are integrated together the power consumption and size are further reduced.

The current sensing latch and quantizers described above can be implemented within flash ADC 250, which in turn is contained in an ADC of FIG. 1. The ADCs thus designed can be implemented in various devices. An example device is described below in further detail.

8. Device

Figure 11:
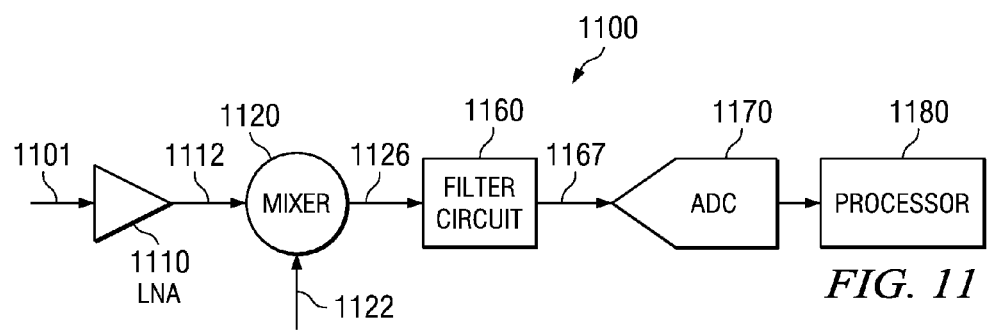
FIG. 11 is a block diagram illustrating the details of implementation of a device in an embodiment of the present invention.

FIG. 11 is a block diagram of receiver system 1100 illustrating an example system in which various aspects of the present invention may be implemented. For illustration, it is assumed that receiver system 1100 is implemented within a Wireless Receiver. However, receiver system 1100 can be implemented in other devices (wireless as well as wire_based communications) as well.

Receiver system 1100 is shown containing low noise amplifiers (LNA) 1110, mixer 1120, filter circuit 1160, analog to digital converter (ADC) 1170, and processor 1180. Each block/stage is described below in further detail.

LNA 1110 receives signals on path 1101 and amplifies the received signals to generate a corresponding amplified signal on path 1112. For example, in wireless systems, the signals that are transmitted from satellites, etc. may be received by an antenna (not shown) and the received signals are provided on path 1101. The received signals may be weak in strength and thus amplified by LNA 1110 for further processing. LNA 1110 may be implemented in a known way.

Mixer 1120 may be used to down_convert the received amplified signal on path 1112 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 1120 may receive the amplified signal on path 1112 and a signal of fixed frequency on path 1122 as inputs, and provides the intermediate signal on path 1126. The signal of fixed frequency on path 1122 may be generated by a phase locked loop (not shown) in a known way.

Filter circuit 1160 may correspond to a low pass filter, which allows the desired low frequencies and rejects all other unwanted high frequencies present in the signal received on line 1126. The filtered signal, which contains the frequency band of interest, is provided on path 1167.

ADC 1170 converts (samples) the filtered signal received on path 1167 to a corresponding digital value, which represents the signal of interest in received signal 1101. Processor 1180 processes the received digital values to provide various user applications and may be implemented as multiple processing units, each potentially operating independently. ADC 1170 may correspond to ADC 500 described in sections above (and implemented according to various aspects of the present invention).

9. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A quantizer generating a first bit, a second bit and a third bit respectively indicating whether an input signal has a strength greater than a first strength, a second strength and a third strength respectively, wherein said third strength is between said first strength and said second strength, said quantizer comprising:
   a first pre-amplifier receiving said input signal on one of an inverting terminal and a non-inverting terminal and a first reference signal having said first strength on the other one of said inverting and non-inverting terminal and generating a first signal and a second signal as a first differential output signal, wherein a first bit is generated from said first differential output signal;
   a second pre-amplifier receiving said input signal on one of an inverting terminal and a non-inverting terminal and a second reference signal having second strength on the other one of said inverting and non-inverting terminal and generating a third signal and a fourth signal as a second differential output signal, wherein a second bit is generated from said second differential output signal;
   a first transistor receiving one of said first signal, second signal, third signal and fourth signal and generating a first current;
   a second transistor receiving another one of said first signal, second signal, third signal and fourth signal and generating a second current; and
   a current latch receiving a first primary current and a second primary current and generating a latch output wherein said latch output is at a first value when said first current is greater than said second current, and at a second value otherwise, wherein said first primary current and said second primary current respectively contain said first current and said second current,
   wherein said latch output represents a third bit between said first quantized value and said second quantized value.

2. The quantizer of claim 1, further comprising:
   a third transistor coupled in parallel to said first transistor and generating a third current; and
   a fourth transistor coupled in parallel to said second transistor and generating a fourth current,
   a gate terminal of each of said third transistor and said fourth transistor connecting to corresponding one of the two remaining ones of said first signal, said second signal, said third signal and said fourth signal,
   said third current and said first current together being provided as said first primary current and said second current and said fourth current together being provided as said second primary current.

3. The quantizer of claim 2, further comprising a fifth transistor, a sixth transistor, a seventh transistor, an eighth transistor and another current latch interconnected identical to said first transistor, said second transistor, said third transistor, said fourth transistor and said current latch, wherein said another latch generates a fourth bit on an another latch output,
   wherein said fourth bit indicates whether said input signal has a strength greater than a fourth strength, wherein said fourth strength is also between said first strength and said second strength,
   wherein said fourth strength is attained to not equal said third strength by choosing different W/L ratios for said fifth transistor, said sixth transistor, said seventh transistor, said eighth transistor compared to said first transistor, said second transistor, said third transistor, said fourth transistor, wherein W/L represents a width to length ratio of conducting channel in the corresponding transistors.

4. The quantizer of claim 3, wherein said first current (IDP) and said second current (IDN) are generated according to:

$$I_{DP}=I_{DC}+\alpha(W/L)[V_{IN}-V_{REF}]$$

and $$I_{DN}=I_{DC}-\alpha(W/L)[V_{IN}-V_{REF}]$$

VIN represents a strength of said input signal, VREF represents a strength of said reference signal, W and L respectively represents width and length of said current channel of the corresponding transistor.

5. The quantizer of claim 4, wherein said first primary current and said primary current (Istprimary) and said second primary current (Isecprimary) are obtained according to $$I \text{stprimary} = I_{DPM} + I_{Dpn} = \alpha[m(V_{IN} - V_{REF1}) + n(V_{IN} - V_{REF2})]$$

and $$I \sec \text{primary} = I_{DMm} + I_{DMm} = \alpha[m(V_{IN} - V_{REF1}) + n(V_{IN} - V_{REF2})]$$

wherein, IDPM and IDPn respectively represents first current and third current, IDMm and IDMn respectively represents second current and fourth current, Vref1 and vref2 represents said first strength and said second strength, Vin represents said strength of input signal, m and n represents Width to length ratio of said first and third transistor and said second and fourth transistor, and alpha represents a constant.

6. The quantizer of claim 3, wherein said current latch comprises:
a ninth transistor and a tenth transistor wherein said first primary current and said second primary current are respectively provided to source terminals of said ninth transistor and said tenth transistor, and said ninth transistor and said tenth transistors are cross coupled such that the drain terminal of said tenth transistor is connected to the gate terminal of said ninth transistor and the drain terminal of said ninth transistor is connected to gate terminal of said tenth transistor,
wherein said latch output is obtained from one of said drain terminals.

7. The quantizer of claim 6, wherein said current latch comprises
a eleventh transistor and twelfth transistor wherein the drain terminal of said ninth transistor is coupled to the drain terminal of said eleventh transistor in a regeneration phase and decoupled in a reset phase, and
the drain terminal of said tenth transistor is coupled to source terminal of said twelfth transistor in said regeneration phase and decoupled in said reset phase, and
said eleventh transistor and said twelfth transistors are cross coupled such that the drain terminal of said elevtn transistor is connected to the gate terminal of said twelfth transistor and the drain terminal of said twelfth transistor is connected to gate terminal of said eleventh transistor,
wherein a supply voltage is provided to the source terminal of said elevnth transistor and said twelfth transistor.

8. A device comprising:
a processor processing a plurality of digital values; and
an analog to digital converter (ADC) sampling an analog signal and generating said plurality of digital values, said ADC comprising a quantizer generating a first bit, a second bit and a third bit respectively indicating whether an input signal has a strength greater than a first strength, a second strength and a third strength respectively, wherein said third strength is between said first strength and said second strength, said quantizer comprising:
a first pre-amplifier receiving said input signal on one of an inverting terminal and a non-inverting terminal and a first reference signal having said first strength on the other one of said inverting and non-inverting terminal and generating a first signal and a second signal as a first differential output signal, wherein a first bit is generated from said first differential output signal;
a second pre-amplifier receiving said input signal on one of an inverting terminal and a non-inverting terminal and a second reference signal having said second strength on the other one of said inverting and non-inverting terminal and generating a third signal and a fourth signal as a second differential output signal, wherein a second bit is generated from said second differential output signal;
a first transistor receiving one of said first signal, second signal, third signal and fourth signal and generating a first current;
a second transistor receiving another one of said first signal, second signal, third signal and fourth signal and generating a second current; and
a current latch receiving a first primary current and a second primary current and generating a latch output wherein said latch output is at a first value when said first current is greater than said second current, and at a second value otherwise, wherein said first primary current and said second primary current respectively contain said first current and said second current,
wherein said latch output represents a third bit between said first quantized value and said second quantized value.

9. The device of claim 8, further comprising:
a third transistor coupled in parallel to said first transistor and generating a third current; and
a fourth transistor coupled in parallel to said second transistor and generating a fourth current,
a gate terminal of each of said third transistor and said fourth transistor connecting to corresponding one of the two remaining ones of said first signal, said second signal, said third signal and said fourth signal,
said third current and said first current together being provided as said first primary current and said second current and said fourth current together being provided as said second primary current.

10. The device of claim 9, further comprising a fifth transistor, a sixth transistor, a seventh transistor, an eighth transistor and another current latch interconnected identical to said first transistor, said second transistor, said third transistor, said fourth transistor and said current latch, wherein said another latch generates a fourth bit on an another latch output,
wherein said fourth bit indicates whether said input signal has a strength greater than a fourth strength, wherein said fourth strength is also between said first strength and said second strength,
wherein said fourth strength is attained to not equal said third strength by choosing different W/L ratios for said fifth transistor, said sixth transistor, said seventh transistor, said eighth transistor compared to said first transistor, said second transistor, said third transistor, said fourth transistor, wherein W/L represents a width to length ratio of conducting channel in the corresponding transistors.

11. The device of claim 10, wherein said first current (IDP) and said second current (IDN) are generated according to:

$$I_{DP} = I_{DC} + \alpha(W/L)[V_{IN} - V_{VREF}]$$

and $$I_{DN} = I_{DC} - \alpha(W/L)[V_{IN} - V_{REF}]$$

VIN represents a strength of said input signal, VREF represents a strength of said reference signal, W and L respectively represents width and length of said current channel of the corresponding transistor.

12. The device of claim 11, wherein said first primary current and said primary current (Istprimary) and said second primary current (Isecprimary) are obtained according to $$\text{Istprimary} = I_{DPM} + I_{Dpn} = \alpha[m(V_{IN} - V_{REF1}) + n(V_{IN} - V_{REF2})]$$

and $$I \sec \text{primary} = I_{DMn} + I_{DMn} = \alpha[m(V_{IN} - V_{REF1}) + n(V_{IN} - V_{REF2})]$$

wherein, IDPM and IDPn respectively represents first current and third current, IDMm and IDMn respectively represents second current and fourth current, Vref1 and vref2 represents said first strength and said second strength, Vin represents said strength of input signal, m and n represents Width to length ratio of said first and third transistor and said second and fourth transistor, and alpha represents a constant.

13. The device of claim 10, wherein said current latch comprises:
- a ninth transistor and a tenth transistor wherein said first primary current and said second primary current are respectively provided to source terminals of said ninth transistor and said tenth transistor, and said ninth transistor and said tenth transistors are cross coupled such that the drain terminal of said tenth transistor is connected to the gate terminal of said ninth transistor and the drain terminal of said eighth transistor is connected to gate terminal of said tenth transistor,
- wherein said latch output is obtained from one of said drain terminals.

14. The device of claim 13, wherein said current latch comprises
- a eleventh transistor and twelfth transistor wherein the drain terminal of said ninth transistor is coupled to the drain terminal of said eleventh transistor in a regeneration phase and decoupled in a reset phase, and
- the drain terminal of said tenth transistor is coupled to source terminal of said twelfth transistor in said regeneration phase and decoupled in said reset phase, and
- said elventh transistor and said twelfth transistors are cross coupled such that the drain terminal of said eleventh transistor is connected to the gate terminal of said twelfth transistor and the drain terminal of said twelfth transistor is connected to gate terminal of said eleventh transistor,
- wherein a supply voltage is provided to the source terminal of said eleventh transistor and said twelfth transistor.

* * * * *